(12) United States Patent
Chiang et al.

(10) Patent No.: US 9,255,329 B2
(45) Date of Patent: *Feb. 9, 2016

(54) MODULATED ION-INDUCED ATOMIC LAYER DEPOSITION (MII-ALD)

(75) Inventors: Tony P. Chiang, Campbell, CA (US); Karl Leeser, San Jose, CA (US)

(73) Assignee: Novellus Systems, Inc., Fremont, CA (US)

(*) Notice: Subject to any disclaimer, the term of this patent is extended or adjusted under 35 U.S.C. 154(b) by 1397 days.

This patent is subject to a terminal disclaimer.

(21) Appl. No.: 12/510,922

(22) Filed: Jul. 28, 2009

(65) Prior Publication Data

US 2010/0055342 A1 Mar. 4, 2010

Related U.S. Application Data

(60) Continuation-in-part of application No. 11/737,118, filed on Apr. 18, 2007, now Pat. No. 7,601,393, which is a continuation of application No. 10/900,830, filed on Jul. 28, 2004, now abandoned, which is a division of (Continued)

(51) Int. Cl.

| | |
|---|---|
| *H05H 1/46* | (2006.01) |
| *C23C 16/06* | (2006.01) |
| *C23C 16/455* | (2006.01) |
| *C23C 16/22* | (2006.01) |
| *C23C 16/46* | (2006.01) |

(Continued)

(52) U.S. Cl.
CPC .......... *C23C 16/45536* (2013.01); *C23C 16/06* (2013.01); *C23C 16/22* (2013.01); *C23C 16/45534* (2013.01); *C23C 16/45538* (2013.01); *C23C 16/463* (2013.01); *H01L 21/28562* (2013.01); *H01L 21/76843* (2013.01)

(58) Field of Classification Search
CPC .............. C23C 16/0272; C23C 16/028; C23C 16/06–16/20; C23C 16/22–16/279; C23C 16/45525–16/45542; C23C 16/463; H01L 21/28562; H01L 21/76843; H01J 37/32082–37/32183; H01J 2237/332; H01J 2237/336; H01J 2237/338; H01J 37/32137–37/32165
USPC ........................................................ 427/535
See application file for complete search history.

(56) References Cited

U.S. PATENT DOCUMENTS

| 4,058,430 A | 11/1977 | Suntola et al. |
| 4,172,108 A | 10/1979 | Maeda |
| 4,389,973 A | 6/1983 | Suntola et al. |

(Continued)

FOREIGN PATENT DOCUMENTS

| EP | 0015 390 B1 | 9/1985 |
| WO | 96/17969 | 6/1996 |

(Continued)

OTHER PUBLICATIONS

Mahajah et al., "Si atomic layer epitaxy based on Si2H6 and remote He plasma bombardment"; Thin Solid Films, vol. 225 (1993, no month) pp. 177-182.*

(Continued)

*Primary Examiner* — Marianne L Padgett
(74) *Attorney, Agent, or Firm* — Weaver Austin Villeneuve & Sampson LLP

(57) ABSTRACT

The present invention relates to a cyclic deposition process suitable for depositing an elemental film. The process employs an enhanced atomic layer deposition technique.

27 Claims, 11 Drawing Sheets

Related U.S. Application Data application No. 09/854,092, filed on May 10, 2001, now Pat. No. 6,878,402, application No. 12/510,922, which is a continuation-in-part of application No. 11/601,491, filed on Nov. 16, 2006, now Pat. No. 7,871,676, which is a continuation-in-part of application No. 10/215,711, filed on Aug. 8, 2002, now abandoned, which is a continuation-in-part of application No. 10/137,851, filed on May 3, 2002, now Pat. No. 6,569,501, which is a continuation of application No. 09/812,285, filed on Mar. 19, 2001, now Pat. No. 6,428,859, application No. 12/510,922, which is a continuation-in-part of application No. 11/498,949, filed on Aug. 2, 2006, now abandoned.

(60) Provisional application No. 60/254,280, filed on Dec. 6, 2000, provisional application No. 60/251,795, filed on Dec. 6, 2000.

(51) Int. Cl.
*H01L 21/285* (2006.01)
*H01L 21/768* (2006.01)

(56) References Cited

U.S. PATENT DOCUMENTS

| | | | |
|---|---|---|---|
| 4,895,107 A | 1/1990 | Yano et al. | |
| 4,900,582 A | 2/1990 | Nakayama et al. | |
| 4,965,090 A * | 10/1990 | Gartner et al. | 427/569 |
| 4,975,252 A | 12/1990 | Nishizawa et al. | |
| 4,985,657 A | 1/1991 | Campbell | |
| 5,283,085 A * | 2/1994 | Gartner et al. | 427/534 |
| 5,420,076 A | 5/1995 | Lee et al. | |
| 5,438,587 A | 8/1995 | Kinley | |
| 5,518,780 A * | 5/1996 | Tamor | C23C 16/342 427/255.38 |
| 5,545,443 A | 8/1996 | Yamada et al. | |
| 5,549,937 A * | 8/1996 | Gartner | 427/576 |
| 5,711,811 A | 1/1998 | Suntola et al. | |
| 5,820,664 A | 10/1998 | Gardiner et al. | |
| 5,916,365 A | 6/1999 | Sherman | |
| 5,939,150 A | 8/1999 | Stelzle et al. | |
| 5,990,017 A * | 11/1999 | Collins et al. | 438/714 |
| 6,015,590 A | 1/2000 | Suntola et al. | |
| 6,060,130 A | 5/2000 | Kim | |
| 6,162,323 A * | 12/2000 | Koshimizu | 156/345.26 |
| 6,200,893 B1 | 3/2001 | Sneh | |
| 6,238,739 B1 | 5/2001 | Madar | |
| 6,265,311 B1 | 7/2001 | Hautala et al. | |
| 6,267,074 B1 | 7/2001 | Okumura | |
| 6,277,745 B1 | 8/2001 | Liu et al. | |
| 6,335,063 B1 | 1/2002 | Chen et al. | |
| 6,348,237 B2 * | 2/2002 | Kohler et al. | 427/489 |
| 6,368,678 B1 | 4/2002 | Bluck et al. | |
| 6,368,954 B1 | 4/2002 | Lapatin et al. | |
| 6,416,822 B1 | 7/2002 | Chiang et al. | |
| 6,428,859 B1 | 8/2002 | Chiang et al. | |
| 6,459,501 B1 | 10/2002 | Holmes | |
| 6,464,779 B1 | 10/2002 | Powell et al. | |
| 6,472,023 B1 | 10/2002 | Wu et al. | |
| 6,475,276 B1 | 11/2002 | Elers et al. | |
| 6,482,262 B1 | 11/2002 | Elers et al. | |
| 6,500,772 B2 | 12/2002 | Chakravarti et al. | |
| 6,511,539 B1 | 1/2003 | Raaijmakers | |
| 6,518,195 B1 | 2/2003 | Collins et al. | |
| 6,569,501 B2 | 5/2003 | Chiang et al. | |
| 6,576,053 B1 | 6/2003 | Kim | |
| 6,576,534 B1 | 6/2003 | Zhang et al. | |
| 6,589,886 B2 | 7/2003 | Kim et al. | |
| 6,627,268 B1 | 9/2003 | Fair et al. | |
| 6,630,201 B2 * | 10/2003 | Chiang et al. | 427/255.28 |
| 6,635,571 B2 | 10/2003 | Joo et al. | |
| 6,649,465 B2 | 11/2003 | Iijima et al. | |
| 6,689,220 B1 * | 2/2004 | Nguyen | 118/695 |
| 6,720,260 B1 | 4/2004 | Fair et al. | |
| 6,759,081 B2 | 7/2004 | Huganen et al. | |
| 6,800,542 B2 | 10/2004 | Kim | |
| 6,849,122 B1 | 2/2005 | Fair | |
| 6,878,402 B2 | 4/2005 | Chiang et al. | |
| 6,949,450 B2 | 9/2005 | Chiang et al. | |
| 6,967,154 B2 | 11/2005 | Meng et al. | |
| 7,015,168 B2 | 3/2006 | Aronowitz et al. | |
| 7,163,721 B2 | 1/2007 | Zhang et al. | |
| 7,166,233 B2 | 1/2007 | Johnson et al. | |
| 7,166,516 B2 | 1/2007 | Furuhashi et al. | |
| 7,211,508 B2 | 5/2007 | Chung et al. | |
| 7,264,846 B2 | 9/2007 | Chang et al. | |
| 7,348,042 B2 * | 3/2008 | Chiang et al. | 427/585 |
| 7,399,357 B2 | 7/2008 | Sherman | |
| 7,422,986 B2 | 9/2008 | Carpenter et al. | |
| 7,625,609 B2 | 12/2009 | Matsuura | |
| 7,871,676 B2 * | 1/2011 | Chiang et al. | 427/533 |
| 7,871,678 B1 | 1/2011 | Greer et al. | |
| 7,897,215 B1 | 3/2011 | Fair et al. | |
| 8,053,372 B1 | 11/2011 | Greer et al. | |
| 8,334,218 B2 * | 12/2012 | Van Nooten et al. | 438/758 |
| 8,747,964 B2 | 6/2014 | Park et al. | |
| 2001/0048981 A1 | 12/2001 | Suzuki | |
| 2001/0054769 A1 | 12/2001 | Raaijmakers et al. | |
| 2002/0045310 A1 | 4/2002 | Iijima et al. | |
| 2002/0068458 A1 | 6/2002 | Chiang et al. | |
| 2002/0076507 A1 | 6/2002 | Chiang | |
| 2002/0104481 A1 | 8/2002 | Chiang et al. | |
| 2002/0127883 A1 | 9/2002 | Conti et al. | |
| 2002/0173054 A1 | 11/2002 | Kim | |
| 2002/0197402 A1 | 12/2002 | Chiang et al. | |
| 2003/0059535 A1 | 3/2003 | Luo et al. | |
| 2003/0161969 A1 | 8/2003 | Hillard | |
| 2004/0105934 A1 | 6/2004 | Chang et al. | |
| 2004/0131796 A1 | 7/2004 | Miyano et al. | |
| 2004/0151844 A1 | 8/2004 | Zhang et al. | |
| 2004/0221798 A1 | 11/2004 | Sherman | |
| 2004/0224504 A1 * | 11/2004 | Gadgil | C23C 16/045 438/680 |
| 2005/0221021 A1 * | 10/2005 | Strang | C23C 16/45525 427/569 |
| 2006/0196418 A1 | 9/2006 | Lindfors et al. | |
| 2007/0087581 A1 | 4/2007 | Singh et al. | |
| 2010/0285237 A1 * | 11/2010 | Ditizio | C23C 16/34 427/569 |
| 2010/0285667 A1 | 11/2010 | Bonilla et al. | |
| 2011/0139748 A1 * | 6/2011 | Donnelly | H01J 37/32036 216/37 |
| 2012/0083134 A1 * | 4/2012 | Wu et al. | 438/761 |
| 2012/0115325 A1 * | 5/2012 | Park et al. | 438/656 |
| 2012/0258602 A1 * | 10/2012 | Subramani et al. | 438/758 |
| 2012/0263887 A1 * | 10/2012 | Papasouliotis et al. | 427/569 |
| 2012/0264291 A1 * | 10/2012 | Ganguli et al. | 438/653 |
| 2012/0321817 A1 * | 12/2012 | Dussarrat et al. | 427/569 |
| 2013/0012003 A1 * | 1/2013 | Haukka et al. | 438/478 |
| 2014/0227880 A1 * | 8/2014 | Shanker et al. | 438/703 |
| 2015/0162168 A1 * | 6/2015 | Oehrlein | H01J 37/32146 438/694 |

FOREIGN PATENT DOCUMENTS

| | | |
|---|---|---|
| WO | 99/01595 | 1/1999 |
| WO | 2012/050770 | 4/2012 |
| WO | 2012/060940 | 5/2012 |

OTHER PUBLICATIONS

R.F. Bunshah et al.; Deposition Technologies for Films and Coatings (Developments and Applications), Materials Science Series (editor R.F. Bunshah); 1982 (no month), Noyes publications, Park Ridge, New Jersey, USA; excerpt chapters 2-3, pp. 19-82.*

E.J. Hellund; The Plasma State, Reinhold publishing Corporation, New York, 1961 (no month), excerpt pp. 65-89.*

U.S. Appl. No. 60/251,795, "Method and apparatus for improved temperature control in atomic layer", Chiang et al., filed Dec. 6, 2000.

U.S. Appl. No. 11/520,455, Office Action mailed Oct. 14, 2008.

(56) References Cited

OTHER PUBLICATIONS

U.S. Appl. No. 11/520,455, "Method of Increasing the Reactivity of a Precursor in a Cyclic Deposition Process," Greer et al., filed Sep. 12, 2006.
U.S. Appl. No. 11/520,497, Office Action mailed Dec. 24, 2008.
U.S. Appl. No. 11/520,497, "Method of Reducing Plasma Stabilization Time in a Cycle Deposition Process," Greer et al., filed Sep. 12, 2006.
U.S. Appl. No. 11/498,949, Office Action mailed Feb. 17, 2009.
U.S. Appl. No. 11/498,949, Office Action mailed Jul. 1, 2008.
U.S. Appl. No. 11/498,949, "Method of Depositing an elemental film", filed Aug. 2, 2006.
U.S. Appl. No. 11/540,937, Office Action mailed Dec. 29, 2008.
U.S. Appl. No. 11/540,937, "Method for Improving the Nucleation and Morphology of Ruthenium Liners Deposited on Tantalum Nitride," Gopinath et al., filed Sep. 29, 2006.
U.S. Appl. No. 10/465,721, Examiner's Answer mailed Apr. 2, 2009.
U.S. Appl. No. 10/465,721, Office Action mailed Apr. 22, 2008.
U.S. Appl. No. 10/465,721, Office Action mailed Oct. 11, 2007.
U.S. Appl. No. 10/465,721, Office Action mailed Aug. 14, 2007.
U.S. Appl. No. 10/465,721, Office Action mailed May 31, 2007.
U.S. Appl. No. 10/465,721, Office Action mailed Dec. 7, 2006.
U.S. Appl. No. 10/465,721, Office Action mailed Aug. 17, 2002.
U.S. Appl. No. 10/465,721, Office Action mailed Jun. 15, 2006.
U.S. Appl. No. 10/465,721, Office Action mailed Jan. 10, 2006.
U.S. Appl. No. 10/465,721, Office Action mailed May 5, 2005.
U.S. Appl. No. 10/465,721, Office Action mailed Nov. 22, 2004.
U.S. Appl. No. 10/465,721, Office Action mailed Jul. 9, 2004.
U.S. Appl. No. 10/465,721, Office Action mailed May 4, 2004.
U.S. Appl. No. 10/465,721, Office Action mailed Dec. 11, 2003.
U.S. Appl. No. 10/465,721, "Sequential UV induced chemical vapor deposition", Fair et al., filed Jun. 18, 2003.
U.S. Appl. No. 11/520,455, Office Action mailed May 14, 2009.
U.S. Appl. No. 11/540,937, Office Action mailed Jul. 22, 2009.
U.S. Appl. No. 12/364,783, filed Feb. 3, 2009, entitled "Selective Plasma Activation Atomic Layer Deposition."
US Office Action, dated Dec. 11, 2002, issued in U.S. Appl. No. 09/849,075.
US Notice of Allowance, dated Jun. 10, 2003, issued in U.S. Appl. No. 09/849,075.
US Notice of Allowance, dated Oct. 25, 2010, issued in U.S. Appl. No. 10/465,721.
US Notice of Allowance, dated Oct. 28, 2003, issued in U.S. Appl. No. 10/600,622.
US Office Action, dated Oct. 16, 2009, issued in U.S. Appl. No. 11/520,455.
US Final Office Action, dated Mar. 2, 2010, issued in U.S. Appl. No. 11/520,455.
US Notice of Allowance, dated Sep. 14, 2010, issued in U.S. Appl. No. 11/520,455.
US Final Office Action, dated May 27, 2010, issued in U.S. Appl. No. 11/520,497.
US Office Action, dated Dec. 9, 2010, issued in U.S. Appl. No. 11/520,497.
US Final Office Action, dated Apr. 14, 2011, issued in U.S. Appl. No. 11/520,497.
US Notice of Allowance, dated Sep. 14, 2011, issued in U.S. Appl. No. 11/520,497.
US Office Action, dated Nov. 25, 2011, issued in U.S. Appl. No. 12/364,783.
US Final Office Action, dated Jul. 19, 2012, issued in U.S. Appl. No. 12/364,783.
Mitzel et al. (1999) "Are there Structurally Relevant Attrative interactions between Nitrogen Atoms and Group 14 Elements in Their Aminomethyl Compounds?" *Organometallics 18*, pp. 3437-3444.
Milov et al. (2004) "Quantum-chemical Investigation of the Hypervalent Intramolecular Coordination X—N (X=C, Si, Ge) in Quasimonocyclic Models of IVa Group Atrane," Russian Journal of Organic Chemistry, vol. 10, No. 2, pp. 261-268; translated from Zhurnal Organicheskoi Khimiz, vol. 40, No. 2, pp. 289-296.
Isopropyl Group. Illustrated Glossary of Organic Chemistry, accessible at http://www.chem.ucla.edu/harding/IGOC/I/isopropyl_group.html, (Nov. 17, 2011).
Walsh, Bond Dissociation Energies in Organosilicon Compounds, online at www.gelest.com/Library/10BondDiss.pdf [created Mar. 31, 2002].
Van der Voort et al. (1993) "Reaction of NH3 with Trichlorosilylated Silica Gel: A study of the Reaction Mechanism as a Function of Temperature," Journal of the Chemical Society Faraday Trans. vol. 89 (14) pp. 2509-2513.
US Examiner's 2nd Answer, dated Aug. 5, 2009, issued in U.S. Appl. No. 10/465,721.
US BPAI Decision on Appeal, dated Oct. 19, 2010, issued in U.S. Appl. No. 10/465,721.
US Office Action, dated Jan. 7, 2013, issued in U.S. Appl. No. 12/364,783.
PCT International Search Report and Written Opinion dated Apr. 19, 2012, issued in PCT/US2011/052516.
PCT International Preliminary Report on Patentability and Written Opinion dated Apr. 11, 2013 issued in PCT/US2011/052516.
PCT International Search Report and Written Opinion dated Apr. 19, 2012, issued in PCT/US2011/053046.
PCT International Preliminary Report on Patentability and Written Opinion dated May 16, 2013, issued in PCT/US2011/053046.
Kim, H., (Nov. 2003) "Atomic layer deposition of metal and nitride thin films: Current research effrots and applications for semicondutor device processing," *J. Vac. Sci. Techno. B*,(6):2231-2261.
US Final Office Action, dated Jul. 30, 2013, issued in U.S. Appl. No. 12/364,783.
US Office Action, dated Sep. 20, 2013, issued in U.S. Appl. No. 13/234,020.
US Office Action, dated May 8, 2014, issued in U.S. Appl. No. 13/234,020.
US Office Action, dated Jun. 18, 2013, issued in U.S. Appl. No. 13/244,009.
US Final Office Action, dated Oct. 11, 2013, issued in U.S. Appl. No. 13/244,009.
US Notice of Allowance, dated Feb. 3, 2014, issued in U.S. Appl. No. 13/244,009.
Chinese Office Action dated Jan. 27, 2015 issued in CN 201180053148.6.
Schmidt et al. (Apr. 23, 2010) "Atomic Layer Deposition of Ta—N-Based Thin Films Using a Tantalum Source," J. Electrochem. Soc., 157(6):H638-H642.
Vartanian, Victor, et al. (2002) "Emissions Characterization of Advanced CVD Processes and Abatement Performance," Editor: L. Mendicino, "Environmental Issues with Materials and Processes for the Electronics and Semiconductor Industries V." Pennington: The Electrochemical Society, 1-11. Print. (8pp), electrocechemical society proceedings vol. 2002-15.

* cited by examiner

MODULATED ION-INDUCED ATOMIC LAYER DEPOSITION (MII-ALD)

CROSS-REFERENCE TO RELATED APPLICATIONS

This application is a continuation-in-part of U.S. application Ser. No. 11/737,118, filed Apr. 18, 2007, which is a continuation of U.S. patent application Ser. No. 10/900,830, filed Jul. 28, 2004, now abandoned, which is a divisional of U.S. patent application Ser. No. 09/854,092, filed May 10, 2001, now U.S. Pat. No. 6,878,402, which claims the benefit of priority to U.S. Provisional Application Nos. 60/251,795 and 60/254,280 both filed Dec. 6, 2000.

This application is also a continuation-in-part of U.S. application Ser. No. 11/601,491 filed Nov. 16, 2006, which is a continuation in part of U.S. Utility application Ser. No. 10/215,711 filed Aug. 8, 2002, now abandoned, which is a continuation-in-part of U.S. application Ser. No. 10/137,851 filed May 3, 2002, now U.S. Pat. No. 6,569,501, which is a continuation of U.S. application Ser. No. 09/812,285, filed Mar. 19, 2001, now U.S. Pat. No. 6,428,859, which claims the benefit of U.S. Provisional Application No. 60/251,795 filed Dec. 6, 2000.

This application is also a continuation-in-part of U.S. application Ser. No. 11/498,949, filed Aug. 2, 2006. All of the aforementioned applications are incorporated herein by reference in their entireties.

TECHNICAL FIELD

The present invention relates generally to the field of thin film deposition methods used in the semiconductor, data storage, flat panel display, as well as allied or other industries. More particularly, the present invention relates to cyclic deposition techniques for depositing an elemental film.

BACKGROUND

As device geometries continue to shrink, one of the challenges facing the semiconductor industry is the deposition of thin, continuous films for use as copper (Cu) diffusion barriers and as seeds for electroplating. A metallic liner like ruthenium (Ru), tantalum (Ta) or cobalt (Co) is needed over a barrier layer, for example, tantalum nitride (TaN), to improve adhesion and electromigration. Another area of need is the copper seed. While atomic layer deposition (ALD) of metal (carbon) nitride layers is well advanced, there are several challenges to growing elemental metallic layers by ALD or chemical vapor deposition (CVD). Some of the problems with growing thin, metal films by CVD or pulsed layer deposition include the incorporation of impurities from the organic ligands or reactant gas, poor nucleation and growth under non-oxidizing conditions, poor step coverage, and lack of continuity.

There are additional problems associated with metal films. For example, the deposition of Ru is difficult in a reducing environment; most ALD chemistries require oxygen or another oxidizing agent. Reducing chemistries have been used, but they typically either require "exotic" reducing agents or have large nucleation delays, that is, the delay in deposition between the time when a substrate is exposed to a metal precursor and the time when the metal actually begins to form on the substrate surface.

Other approaches require the intermediate deposition of or conversion to an oxide or nitride followed by the subsequent reduction to the elemental state. This type of method results in a metal film containing large amounts of contaminants, namely, oxygen or nitrogen, which increases the resistivity of the resulting film. Moreover, the ability to reduce a previously-deposited film is limited to a certain thickness because the reduction process has a finite, practical, penetration depth.

SUMMARY

In one aspect, the invention features a method for forming an elemental film on a substrate in a chamber. The method comprises introducing a reactant gas into the chamber. The reactant gas forms an adsorbed layer of the reactant gas on the substrate. At least one ion generating feed gas is introduced into the chamber, and a plasma is generated from the ion generating feed gas to form ions. The substrate is exposed to the ions, and the ions are modulated. The adsorbed reactant gas reacts with the ions to form the elemental film.

In another aspect, the invention features a method for depositing an elemental film on a substrate in a chamber wherein a reactant gas is introduced into the chamber. The reactant gas forms an adsorbed layer of the reactant gas on the substrate. Any excess reactant gas is removed from the chamber. At least one ion generating feed gas is introduced into the chamber, and a plasma is generated from the ion generating feed gas to form ions. The substrate is exposed to the ions, and the ions are modulated. The adsorbed reactant gas reacts with the ions to form the elemental film.

Various implementations of the invention may include one or more of the following features. Adsorption of the reactant gas on the substrate occurs via chemisorption. The method is repeated until the film achieves a desired thickness. The reacting step occurs in a reducing environment. The removal of the reactant gas is achieved by evacuating or purging the chamber. The ion generating feed gas is selected from a group consisting of argon, krypton, neon, helium, and xenon. The generated ions are selected from a group consisting of $Ar^+$, $Kr^+$, $Ne^+$, $He^+$, and $Xe^+$. The modulating step is accomplished by modulating an ion flux or modulating an ion energy. The substrate is maintained at a temperature of between about 25° C. and 400° C. The adsorbed reactant gas is reduced to its elemental state by an ion-induced surface reaction.

In yet another aspect, the invention is directed to a method for depositing an elemental film onto a substrate in a chamber. The method includes introducing a reactant gas into the chamber. The reactant gas forms an adsorbed layer of the reactant gas on the substrate. Any excess reactant gas is removed from the chamber. At least one ion generating feed gas and at least one radical generating feed gas are introduced into the chamber. A plasma is generated from the ion generating feed gas and the radical generating feed gas to form ions and radicals. The substrate is exposed to the ions and radicals. The ions are modulated. The adsorbed reactant gas reacts with the ions and radicals to form the elemental film wherein the radicals are not incorporated in the film.

Various implementations of the invention may include one or more of the following features. The substrate is simultaneously exposed to the ions and the radicals. The substrate is exposed to the ions after exposure to the radicals. The substrate is electrically biased to a negative potential relative to ground. The radical generating feed gas is selected from the group consisting of $H_2$, $N_2$, and $NH_3$ vapor. The generated radicals are selected from a group consisting of hydrogen atoms, nitrogen atoms, and NH molecules. The method is repeated until the film achieves a desired thickness. The reactant gas is removed by evacuating or purging the chamber. The adsorbed reactant is reduced to its elemental state by an ion-induced surface reaction.

In still another aspect, the invention is directed to a method for forming an elemental film on a substrate. The method includes introducing a reactant gas into a chamber. The reactant gas forms an adsorbed layer of the reactant gas on the substrate. At least one ion generating feed gas is introduced into the chamber. A plasma is generated from the ion generating feed gas to form ions. The substrate is exposed to the ions, and the ions are modulated. The adsorbed reactant gas is reacted with the ions to form the elemental film on the substrate without first having formed any intermediate film on the substrate.

The invention can include one or more of the following advantages. It does not require an oxidizing environment. It does not require the intermediate deposition of or conversion to an oxide or nitride followed by the subsequent reduction to the elemental state. Film deposition may occur at significantly lower temperatures. The invention provides purer elemental films with reduced nucleation delay and improved morphology. This provides the added benefit of higher capital productivity.

The details of one or more embodiments are set forth in the accompanying drawings and the description below. Other features, objects and advantages will be apparent from the description and drawings, and from the claims.

DETAILED DESCRIPTION

The present invention employs a cyclic deposition technique for depositing an elemental film wherein a substrate is exposed to a precursor dose followed by an ion-induced reduction of the adsorbed precursor layer to an elemental film. The invention can use modulated ion-induced atomic layer deposition (MII-ALD) in a reducing environment. This permits the deposition of, for example, a Ru on a TaN barrier, without oxidizing the barrier. The technique is applicable to elemental film deposition including, for example, Ru, Cu, Co, Ta, tungsten (W) and palladium (Pd). A second reactant or process gas used in the technique is not incorporated in the film, but aids in the sequential reduction in combination with ions from an inert gas. Specifically, it helps cleave the ligand from the metal. In some cases, a second process gas is unnecessary, as the activation energy provided by ions are sufficient to induce the reduction of the adsorbed precursor layer. The energy imparted by the ions mediated by the surface of the substrate removes the ligands from the adsorbed precursor and triggers the formation of a pure, dense, elemental film. In some embodiments, an additional process gas, for example ammonia ($NH_3$) for Ru MII-ALD, is used to reduce nucleation delay. The MII-ALD technique enables deposition to occur at significantly lower temperatures than thermal ALD and results in purer elemental films.

The present invention allows for the deposition of an elemental film directly on a substrate without first depositing an intermediate film on the substrate. For example, to form a Cu film on a substrate there is no need to first deposit an intermediate copper oxide film and then reduce that film to Cu. The present invention provides for film reduction on a per cycle basis.

Figure 1:
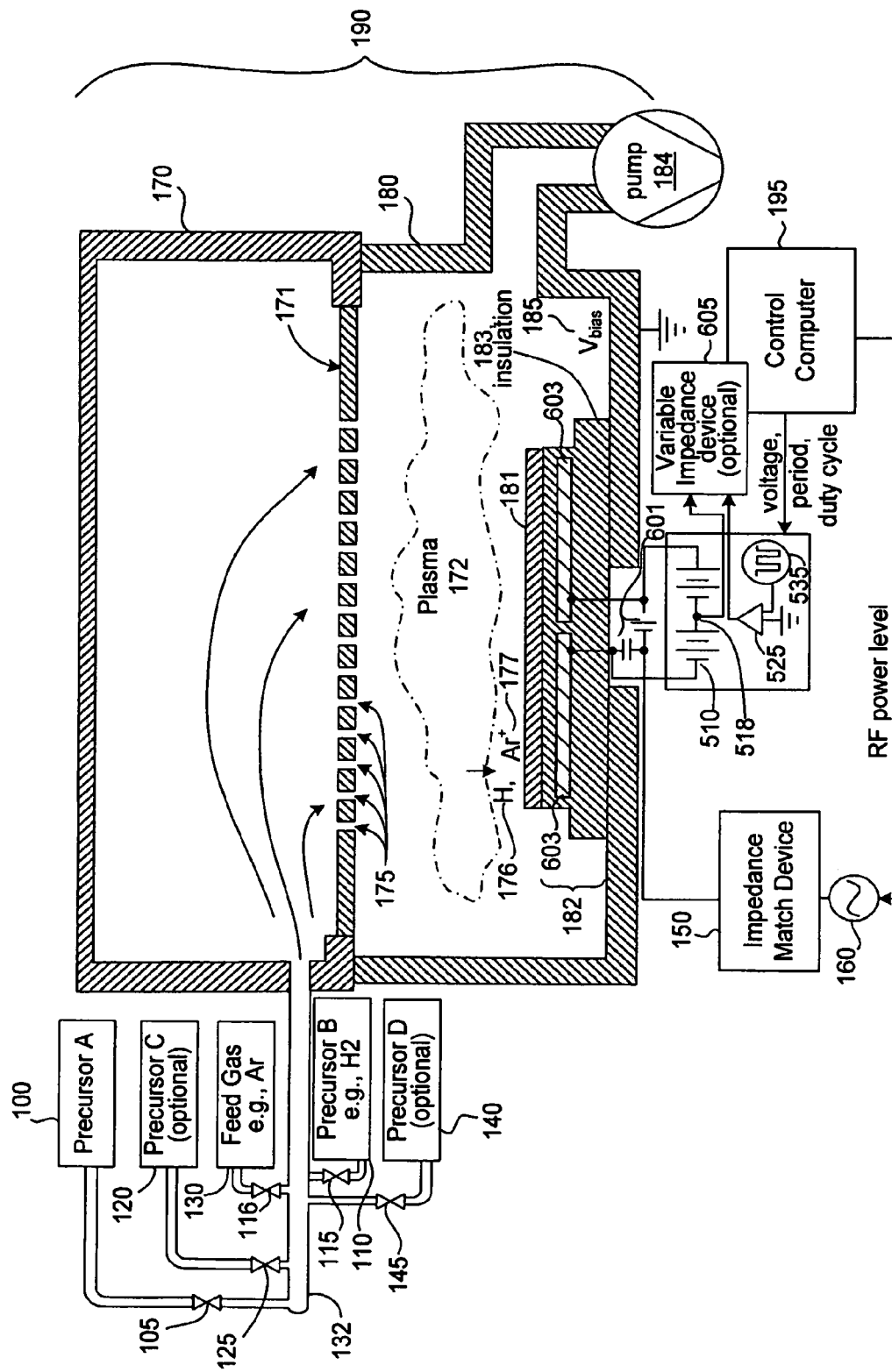
FIG. 1 is a schematic of a deposition system suitable for modulated ion-induced atomic layer deposition (MII-ALD).

FIG. 1 illustrates a deposition system suitable for MII-ALD. The MII-ALD system described incorporates a means of modulating the exposure of the substrate to ions. By modulating (1) the ion flux, (2) the energy of the ions striking the substrate, or a combination of (1) and (2), the deposition reaction can be precisely toggled "on" or "off". If the ion flux or energy is at a "low" state, then no deposition results or deposition occurs so slowly that essentially no deposition results. If the impinging ion flux or energy is at a "high" state, then deposition occurs. Since a substrate, which may be a "bare" substrate, for example, a silicon wafer before any films have been deposited, or a substrate which may already have had one or more films deposited on its surface, is maintained at a low substrate temperature, the ions and second reactant (if present) do not thermally react with the adsorbed layer at any appreciable rate or do not react at all. Instead, the deposition reaction only takes place when either the ion flux or ion energy is toggled to a suitable "high state". The desired film thickness is built-up by repeating the ion pulses (either of flux or energy) the required number of cycles. An MII-ALD system and method are described in U.S. Pat. No. 6,416,822, entitled "Continuous method for depositing a film by modulated ion-induced atomic layer deposition (MII-ALD)", and U.S. Pat. No. 6,428,859, entitled "Sequential method for depositing a film by modulated ion-induced atomic layer deposition (MII-ALD)", which are both herein incorporated by reference.

In the deposition system of FIG. 1, all of the ion/radical generating feed gases and the precursor gases are introduced into a main body chamber 190 via a distribution showerhead 171 comprised of a series of arrays or apertures 175. However, other means for uniformly distributing gases essentially parallel or perpendicular to a face of a substrate 181 may also be used. It will be appreciated that although the showerhead 171 is shown to be above the substrate 181 to direct a gas flow downwards towards the substrate 181, alternative lateral gas introduction schemes are possible with this embodiment. Various lateral gas introduction schemes are described in U.S. Publication No.: US2002/0197402A1, Publication Date: Dec. 26, 2002, entitled "System for depositing a film by modulated ion-induced atomic layer deposition (MII-ALD)", application Ser. No. 10/215,711, filed Aug. 8, 2002, which is herein incorporated by reference.

In the embodiment of FIG. 1, a source of RF bias power 160 is coupled to one or more ESC electrodes 603 in a substrate pedestal 182, which includes insulation 183, via an impedance matching device 150. The ESC electrodes 603 may be of any arbitrary shape. The RF bias power provides power for both ion generation during modulated ion induced atomic layer deposition and energy control of the generated ions. The applied RF bias power is used to generate a plasma 172 in a main process chamber 180, for example, between the substrate 181 and the showerhead 171 to dissociate feed gases 110, 130 to generate ions 177 and radicals 176 and to induce a negative potential $V_{bias}$ 185 (i.e., a DC offset voltage typically −10V to −80V at ≤150 W RF power and 0.1-1 Torr pressure) on the substrate 181. The negative potential $V_{bias}$ 185 modulates the energy of the positively charged ions in the plasma and attracts the positively charged ions toward the surface of the substrate. The positively charged ions impinge on the substrate 181, driving the deposition reaction and improving the density of the deposited film. The ion energy is more specifically given by $E=e|V_p|+e|V_{bias}|$, where $V_p$ is the plasma potential (typically 10V to 20V) and $V_{bias}$ is the negative potential $V_{bias}$ 185 induced on the substrate 181. The negative potential $V_{bias}$ 185 is controlled by the applied RF bias power. For a given process region geometry, the induced negative potential $V_{bias}$ 185 increases with increasing RF bias power and decreases with decreasing RF bias power.

Controlling the RF bias power also controls the density and hence the number of ions generated in the plasma. Increasing the RF bias power generally increases the ion density, leading to an increase in the flux of ions impinging on the substrate. Higher RF bias powers are also required for larger substrate diameters. A preferred power density is ≤0.5 W/cm², which equates to approximately ≤150 W for a 200 mm diameter substrate. Power densities ≥3 W/cm² (greater than about 1000 W for a 200 mm diameter substrate) may lead to undesired sputtering of the deposited film.

The frequency of the RF bias power can be 400 kHz, 13.56 MHz, or higher (e.g. 60 MHz, etc.). A low frequency (e.g. 400 kHz), however, can lead to a broad ion energy distribution with high energy tails which may cause excessive sputtering. The higher frequencies (e.g., 13.56 MHz or greater) lead to tighter ion energy distributions with lower mean ion energies, which is favorable for modulated ion-induced ALD deposition processes. The more uniform ion energy distribution occurs because the RF bias polarity switches before ions can impinge on the substrate, such that the ions see a time-averaged potential.

As shown in FIG. 1, source of applied DC bias can also be coupled to the ESC substrate pedestal 182. The source can be a DC power supply 510 coupled by a center tap 518 to a voltage source 525 with the ability to vary the voltage or exhibit an infinite impedance. Optionally, a variable impedance device 605 may be coupled in series between the voltage source 525 and the center tap 518 of the DC power supply 510. The voltage source 525 is itself coupled to a waveform generator 535. The waveform generator may be a variable-type waveform generator. An exemplary variable-type waveform generator may be controlled by a control computer 195 and have a variable waveform at different times within a given process and may additionally have a non-periodic output signal. The source of applied DC bias can be coupled to the ESC substrate pedestal 182 by RF blocking capacitors 601 that both provide a DC open for the DC power supply 510 and prevent RF energy from corrupting the DC power supply 510.

In MII-ALD, the same plasma is used to generate both ions 177 (used to drive the surface reactions) and radicals 176 (used to assist in driving the surface reactions). As noted, the second reactant is not incorporated in the film, and in some cases, a second reactant is not necessary.

The MII-ALD system utilizes ion imparted kinetic energy transfer rather than thermal energy (for example, ALD, radical enhanced atomic layer deposition (REALD), plasma enhanced chemical vapor deposition (PECVD), CVD, etc.) to drive the deposition reaction. Since temperature can be used as a secondary control variable, with this enhancement, films can be deposited using MII-ALD at arbitrarily low substrate temperatures (generally less than 350° C.). In particular, films can be deposited at or near room temperature (that is, 25° C.) or below. Cu, however, would be deposited at about 60° C. to 200° C., or lower.

A substantially enclosed chamber 170, as shown in FIG. 1, is located in substantial communication with or substantially within the main chamber body 190. The feed gases 110, 130 are delivered to the chamber 170 via valving 115 and 116, and a gas feed line 132. Typical feed gases 130 used for ion generation include, but are not restricted to, argon (Ar), krypton (Kr), neon (Ne), helium (He) and xenon (Xe). Typical feed gases 110 (for example, precursor B) used for radical generation include, but are not restricted to, gaseous hydrogen ($H_2$), nitrogen ($N_2$), and $NH_3$ vapor. The ions 177 are used to deliver the energy needed to reduce the first adsorbed reactant to an elemental film. The generated radicals 176, if present, assist in the reduction of the adsorbed layer.

A first reactant 100 (for example, precursor A) is introduced to the chamber 170 via valving 105 and the gas feed line 132. Precursor A may be any one or more of a series of gaseous compounds used for depositing metals, metal compounds, or the like that are well-known in the art (for example, RuCp (ruthenium cyclopentadiene), PDEAT (pentakis(diethylamido)tantalum), PEMAT (pentakis(ethylmethylamido)tantalum), $TaBr_5$, $TaCl_5$, TBTDET (t-butylimino tris (diethylamino)tantalum), $TiCl_4$, TDMAT (tetrakis (dimethylamido)titanium), TDEAT (tetrakis(diethylamino) titanium), CuCl, Cupraselect® ((Trimethylvinylsilyl) hexafluoroacetylacetonato Copper I), $W(CO)_6$, $WF_6$, $RuEt_2Cp$ (Di ethyl Ruthenocene), RuEtMtCp (Ethyl Methyl Ruthenocene), and RuDER (Ruthenium Ethyl Cyclopentadienyl Dimethyl Pentadienyl).

Figure 2:
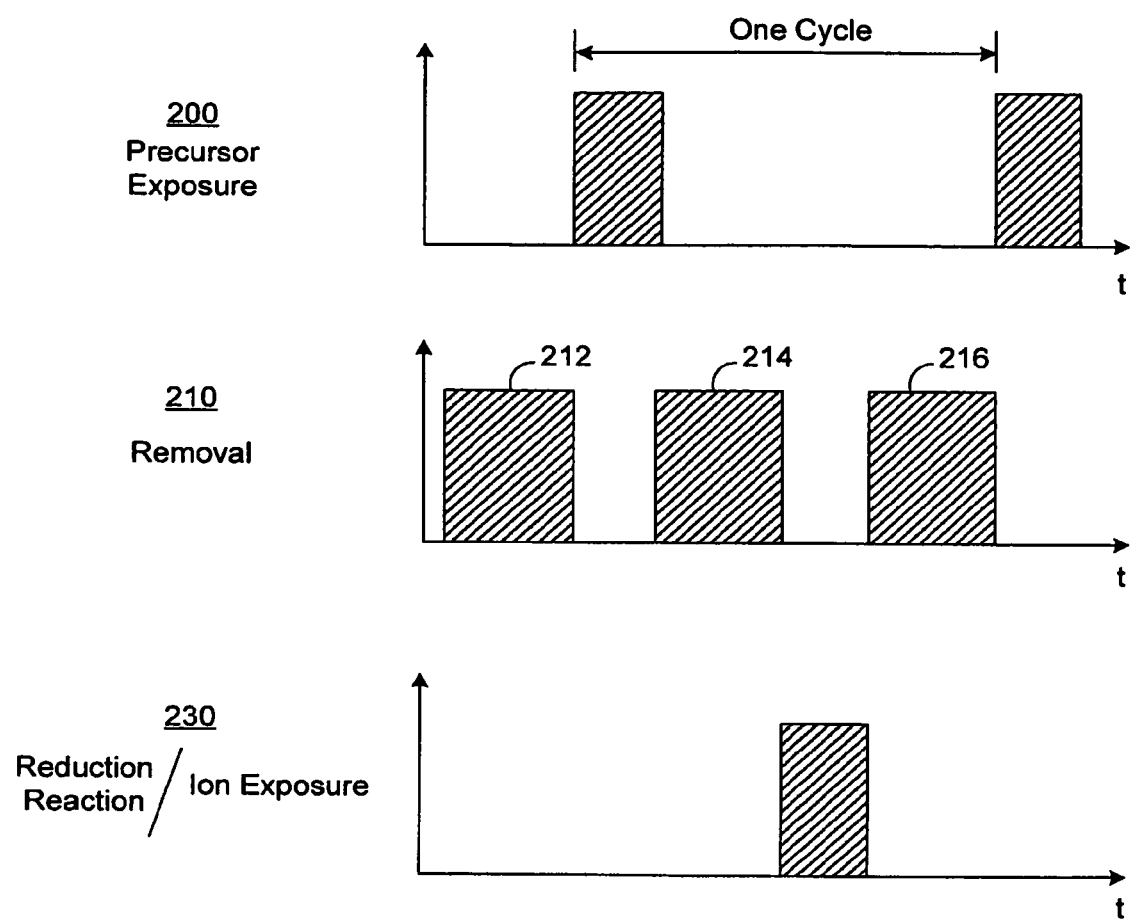
FIG. 2 depicts a timing sequence for an MII-ALD method for reducing an adsorbed precursor to an elemental film.

FIG. 2 depicts a sequence for an MII-ALD method incorporating periodic exposure of the substrate to ions. In this method, ion exposure initiates the reduction reaction 230, and a second gaseous reactant is not used. This figure illustrates one embodiment of MII-ALD utilizing the apparatus described in FIG. 1. This results in a sequential ALD process as follows:

1) Precursor exposure 200: The substrate 181 is exposed to a gaseous reactant 100 (for example, precursor A) for depositing a metal film. During this step, a monolayer of the reactant is adsorbed on the surface of the substrate. Generally, the substrate 181 may be at a temperature below the decomposition temperature of the gaseous reactant.

2) First removal 210: The excess reactant 100 is removed by evacuating 214 the chamber 180 with a vacuum pump 184. Alternatively, in another configuration, the excess reactant is purged from the chamber. Note that prior to the first exposure 200, the chamber was initially evacuated or purged 212.

3) Reduction reaction 230: The substrate 181 is exposed to ions 177 with the substrate 181 biased to a negative potential $V_{bias}$ 185. The ions, (for example, argon-ion ($Ar^+$)), will strike the wafer 181 with an energy (E) approximately equal to $(e|V_{bias}|+e|V_p|)$ where $V_p$ is the plasma 172 potential (typically 10V to 20V) and $V_{bias}$ is the negative potential bias 185 induced on the substrate. With the activation energy now primarily supplied by ions 177 instead of thermal energy, the adsorbed reactant is reduced to its elemental state via an ion-induced surface reaction to produce a solid thin monolayer of the desired film at a reduced substrate temperature, for example, on the order of between about 25° C. and 400° C. The deposition reaction is self-limiting in that the reaction terminates after the initial monolayer of the first reactant is consumed. The ions induce a reaction either in the adsorbed layer or between the adsorbed layer and the substrate surface. The reaction time depends on the reactive species, and different energy levels will be required for different precursors.

4) Second removal 210: The chamber 180 may be evacuated or purged 216.

5) Repeat: The desired film thickness is built up by repeating the entire process cycle (steps 1-4) many times.

Figure 3:
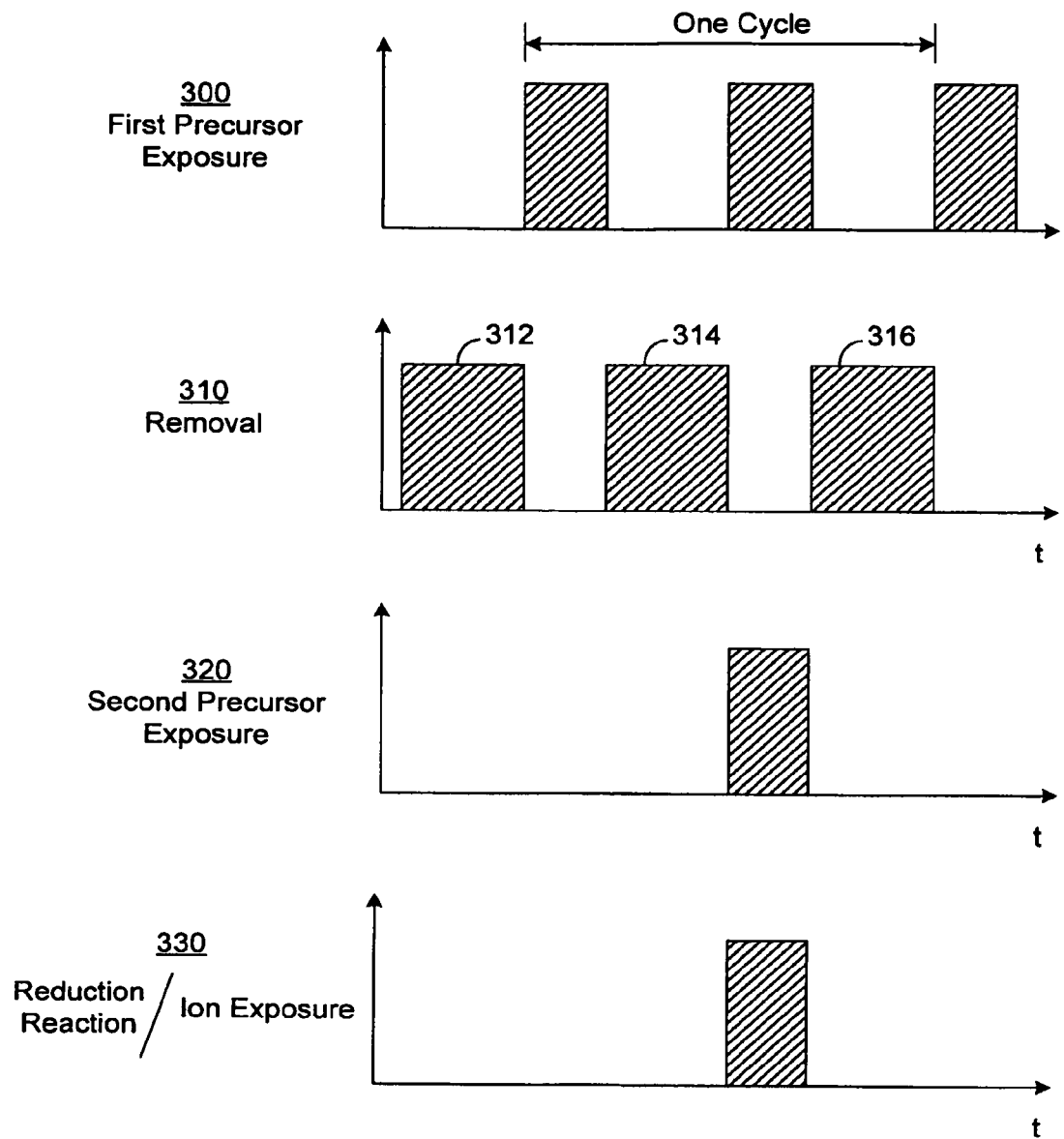
FIG. 3 is a timing sequence for an MII-ALD method for depositing a Ru metallic liner on a barrier layer.

As shown in FIG. 3, the technique of the present invention may also be used with a second gaseous reactant. In this technique, reduction reaction/ion exposure 330 begins with the introduction of a second precursor 320. The second precursor, as noted, is not incorporated in film. Rather, it aids in the reduction of the first precursor to its elemental state.

This technique may be used to deposit a Ru liner on a TaN barrier layer. The TaN layer may be formed, for example, by either the MII-ALD sequential or continuous process as described in the above-mentioned U.S. Pat. Nos. 6,416,822 and 6,428,859. The deposition of the TaN layer may be terminated with or without plasma treatment, which is used to reduce resistivity and possible contaminants (i.e. carbon), and surface pre-treatment. A surface pre-treatment would employ a vapor mixture of amine-containing compounds and an inert carrier gas, for example, Ar. Thereafter, as shown in FIG. 3, a Ru MII-ALD process is as follows:

1) First precursor exposure 300: The substrate with the TaN barrier layer is exposed to a vapor mixture of Ru (Precursor A) and an inert carrier gas, such as Ar. The Ru precursor may be one of the following gaseous compounds: ruthenocene [Ru(Cp)$_2$], diethyl ruthenocene [Ru(Et)(Cp)$_2$], ethyl methyl ruthenium, ethyl cyclopentadienyl dimethyl pentadienyl ruthenium, dimethyl pentadienyl ruthenium or other such ruthenium compounds. The substrate may be at a temperature of between about 200 and 415° C. The deposition of the Ru may occur in the same chamber in which the TaN film was deposited. Alternatively, the substrate may be transferred to a different chamber or module for deposition of the Ru liner.

2) First removal 310: The excess Ru precursor is evacuated or purged 314 from the chamber 180. If the Ru is deposited in the same chamber as was the TaN, then prior to the first exposure, the excess reactant or catalyst used in forming the TaN layer is evacuated or purged 312 from the chamber 180.

3) Reduction reaction 330: The substrate is simultaneously exposed to a second gaseous reactant (radicals at 320) and ions (at 330) with the substrate biased to a negative potential $V_{bias}$. The second gaseous reactant, in this process, is NH$_3$ and the ion-generating gas is Ar. Power 160 is supplied to generate both the ions 177 and the radicals 176. The ions will strike the wafer 181 with an energy approximately equal to $(e|V_{bias}|+e|V_p|)$ where $V_p$ is the plasma 172 potential (typically 10V to 20V), and $V_{bias}$ is the negative potential bias 185 induced on the substrate. The Ru adsorbed onto the substrate is reduced to its elemental state via an ion-induced surface reaction to produce a solid thin monolayer of Ru film. The generated radicals are not incorporated into the film. Rather, they assist in the reduction of the adsorbed Ru, and they reduce nucleation delay. The deposition reaction is self-limiting in that the reaction terminates after the initial monolayer of the first reactant is consumed. The ions induce a reaction either in the adsorbed Ru layer or between the adsorbed Ru layer and the substrate surface.

4) Second removal 310: The excess NH$_3$ and Ar are removed by again evacuating or purging 316 the chamber.

5) Repeat: The desired film thickness is built up by repeating the entire process cycle (Steps 1-4) many times.

The process allows for the chemisorption of the Ru precursor onto the substrate, rather than physisorption of the Ru. The process produces a smooth, conformal and continuous film with minimal nucleation delay. The Ru film has high purity and low resistivity. The process uses a reducing chemistry that does not oxidize the underlying barrier. The adsorbed Ru precursor is reduced to elemental Ru through an ion-induced phenomenon, that is, a surface mitigated effect and not a plasma assisted or enhanced process. The process improves barrier properties and adhesion of the Ru to the underlying barrier.

Figure 4:
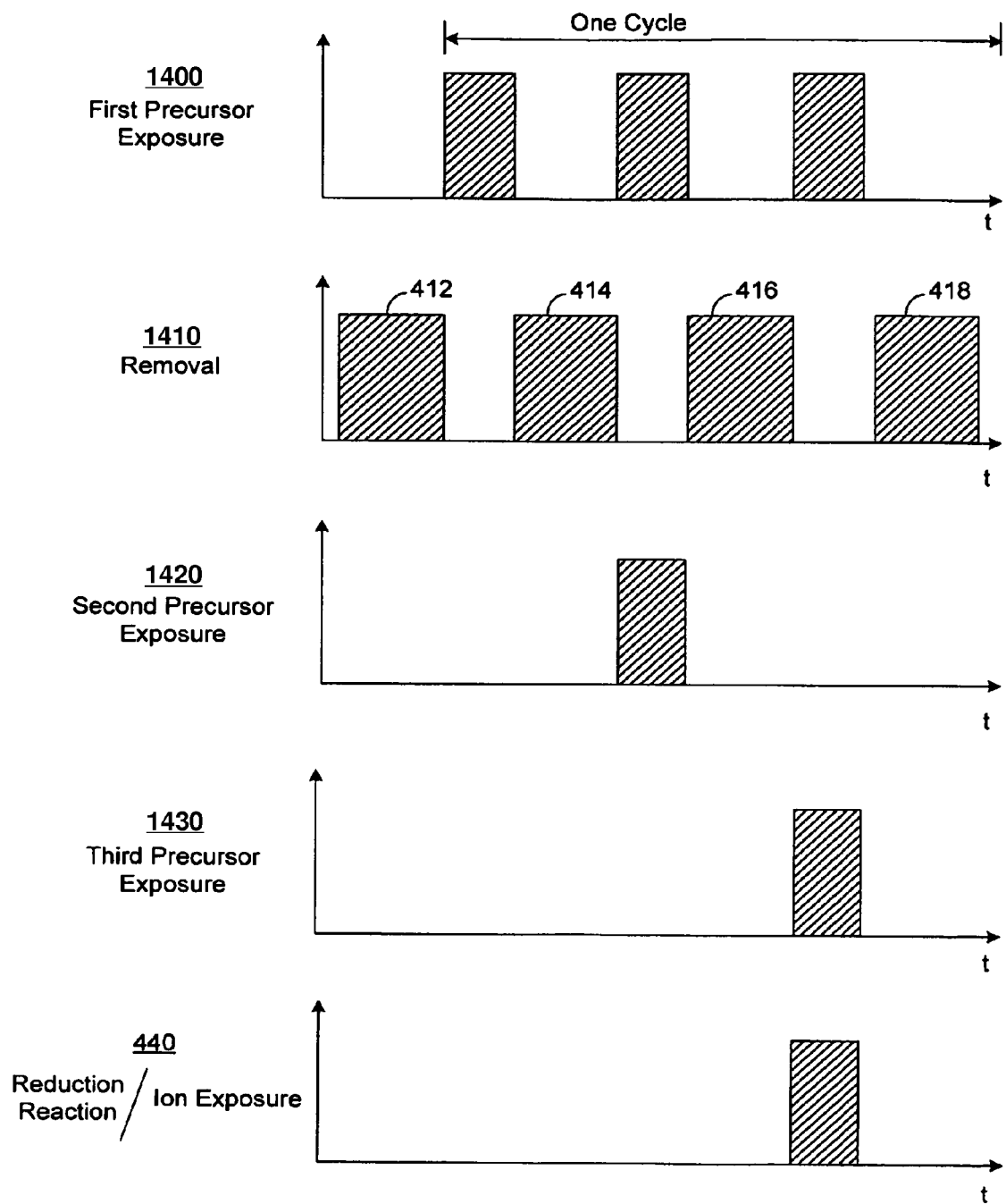
FIG. 4 is a timing sequence for an MII-ALD method for Cu seed deposition.

Another process in accordance with the present invention is a Cu seed deposition process at a temperature of around 65° C. This is significantly lower than typical thermal ALD where deposition temperatures greater than 100° C. are required. The lower temperature provides improved film morphology which is essential for void free fill. The process, as shown in FIG. 4, is as follows:

1) First precursor exposure 1400: The substrate is exposed to a Cu precursor and an inert carrier gas, such as Ar. The substrate may be at a temperature of between about 60° C. and 200° C., or lower.

2) Removal 1410: The excess Cu precursor and inert carrier gas are evacuated or purged 414 from the chamber 180. Note that prior to the first exposure 1400, the chamber was initially evacuated or purged 412.

3) Second precursor exposure 1420: The substrate is exposed to a second precursor or reactant such as water vapor or isopropyl alcohol (IPA). This is an optional step. It is used to help cleave the ligands. Thereafter, the chamber may be purged 416 with an inert gas.

4) Reduction reaction 1430: The substrate is simultaneously exposed to a third gaseous reactant (radicals at 1430) and ions (at 440) with the substrate biased to a negative potential $V_{bias}$. The third gaseous reactant, in this process, may be H$_2$ of He and the ion-generating gas is Ar. Power 160 is supplied into the chamber 180 to generate both the ions 177 and the radicals 176. The Cu adsorbed onto the substrate is reduced to its elemental state via an ion-induced surface reaction to produce a solid thin monolayer of Cu film. The generated radicals are not incorporated into the film. Rather, they assist in the reduction of the adsorbed Cu, and they reduce nucleation delay. The deposition reaction is self-limiting in that the reaction terminates after the initial monolayer of the first reactant is consumed. The ions induce a reaction either in the adsorbed Cu layer or between the adsorbed Cu layer and the substrate surface.

5) Removal 1410: The excess gases are removed by again evacuating or purging 418 the chamber.

6) Repeat: the desired film thickness is built up by repeating the entire process cycle (Steps 1-4) many times.

Figure 5:
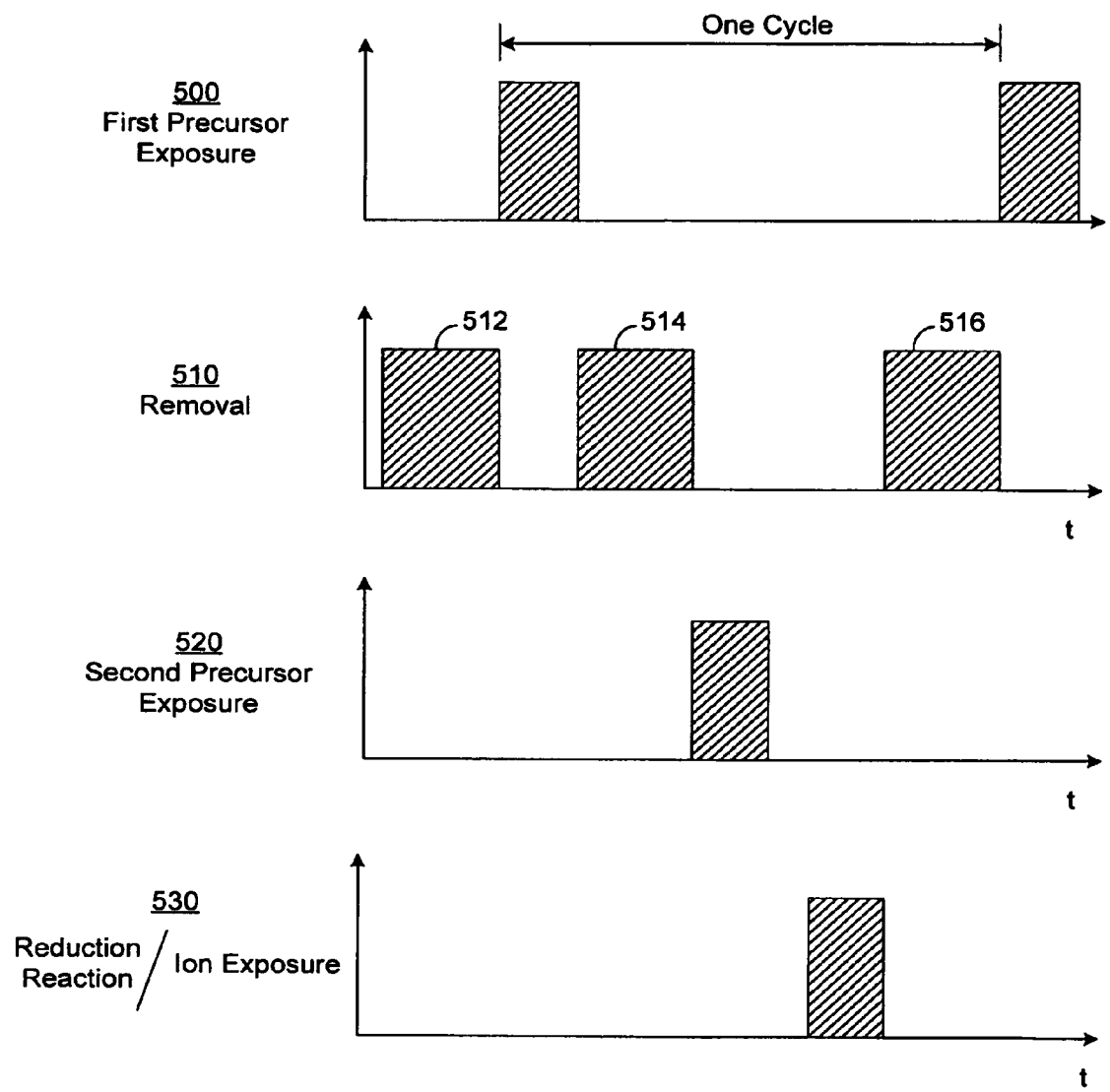
FIG. 5 is another timing sequence for an MII-ALD method for reducing an adsorbed precursor to an elemental film.

A variant of the method shown in FIG. 3 is illustrated in FIG. 5 where ion exposure 530 is initiated after the second reactant exposure 520. FIG. 5 depicts a sequence for a method incorporating periodic exposure of the substrate 181 to ions 177. In this variant of the method, reduction reaction/ion exposure 530 begins after the second precursor 520 ends. The removal 510 may occur periodically, as shown by the removals 512, 514, and 516.

Additional precursor gases (for example, 120, 140) may be introduced and removed (via valving 125 and 145, and the feed line 132) as required for a given process to create tailored films of varying compositions or materials. As an example, an optional exposure may occur in the case of a compound barrier of varying composition. For example, a TaN$_x$/Ta film stack is of interest in copper technology since TaN$_x$ prevents fluorine attack from the underlying fluorinated low-k dielectrics, whereas the Ta promotes better adhesion and crystallographic orientation for the overlying copper seed layer. The TaN$_x$ film may be deposited using a tantalum containing precursor (for example, TaCl$_5$, PEMAT, PDEAT, TBTDET) as the first reactant 100 (precursor A) and a mixture of atomic hydrogen and atomic nitrogen (that is, flowing a mixture of H$_2$ and N$_2$ into the plasma source 172) as the second reactant to produce a TaN$_x$ film. Simultaneous ion exposure is used to drive the deposition reaction. Next a Ta film may be deposited in a similar fashion by using atomic hydrogen (as opposed to a mixture of atomic hydrogen and nitrogen) as the second reactant. An example of a tailored film stack of differing materials can be the subsequent deposition of a copper layer over the TaN$_x$/Ta bi-layer via the use of a copper containing organometallic (for example, Cu(TMVS)(hfac) or (Trimethylvinylsilyl) hexafluoroacetylacetonato Copper I, also known by the trade name CupraSelect®, available from Schumacher, a unit of Air Products and Chemicals, Inc., 1969 Palomar Oaks Way, Carlsbad, Calif. 92009) or inorganic precursor (e.g. CuCl) shown as precursor C 120 in FIG. 1. The copper layer can serve as the seed layer for subsequent electroless or electroplating deposition.

In another embodiment of the MII-ALD process, a substrate 181 heated (for example, to a low temperature of less than or equal to 350° C.) or unheated is simultaneously exposed to a first reactant and a second reactant and subjected to modulated ion 177 exposure. By modulating (1) the ion flux (that is, the number of ions hitting the substrate per unit area per unit time); (2) the energy of the ions striking the substrate; or a combination of (1) and (2), the deposition reaction can be precisely toggled "on" or "off". Since the substrate 181 is maintained at a low substrate temperature, the first and second reactants do not thermally react with any appreciable rate or do not react at all when the ion flux or energy is toggled to a "low" state. Instead, the deposition reaction only takes place when either the ion flux or ion energy is toggled to a suitable "high state". Ion flux or energy modulation can vary generally from 0.1 Hz to 20 MHz or from 0.01 KHz to 10 KHz. During deposition, the main process chamber 180 pressure can be maintained in the range of generally $10^2$ to $10^{-7}$ torr or from $10^1$ to $10^{-4}$ torr, depending on the chemistry involved. The desired film thickness is attained via exposure of the substrate to the suitable number of modulated ion flux or energy pulse cycles. This MII-ALD scheme results in a continuous deposition process. The modulation can be either of the ion flux via the plasma power or of the ion energy via an applied periodic wafer bias.

Figure 6A:
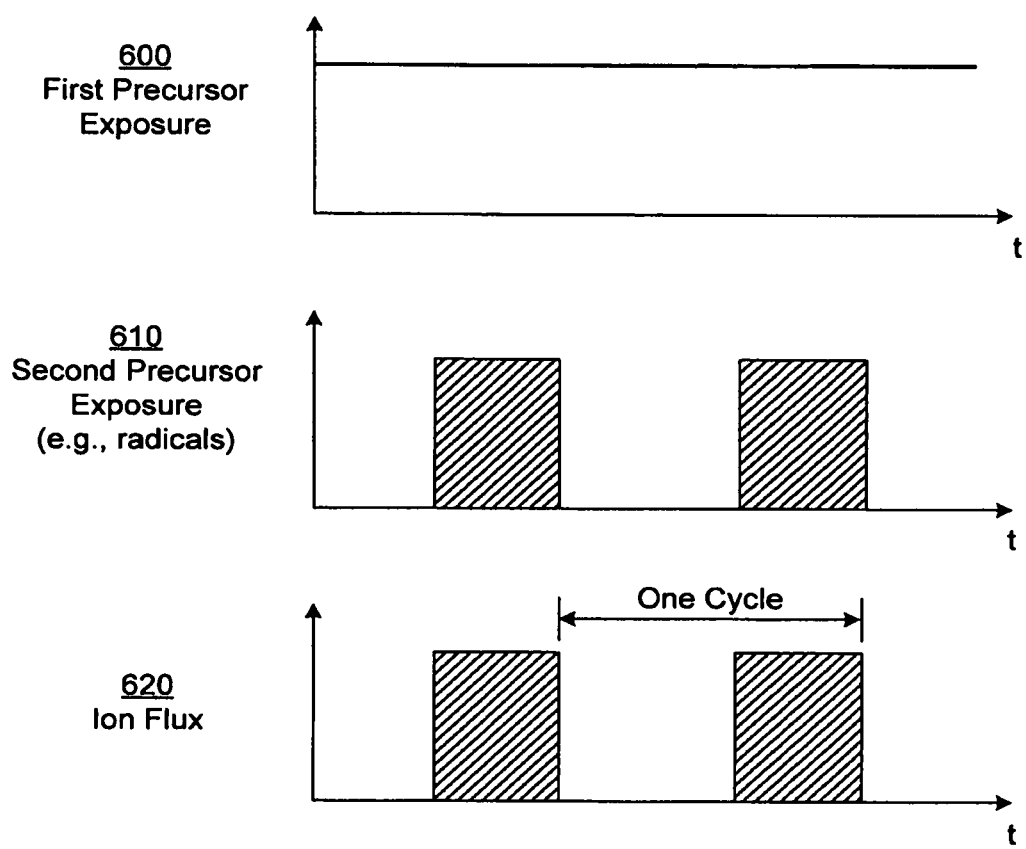
FIG. 6A shows the MII-ALD method utilizing ion flux modulation to vary the substrate exposure to ions.
Figure 7A:
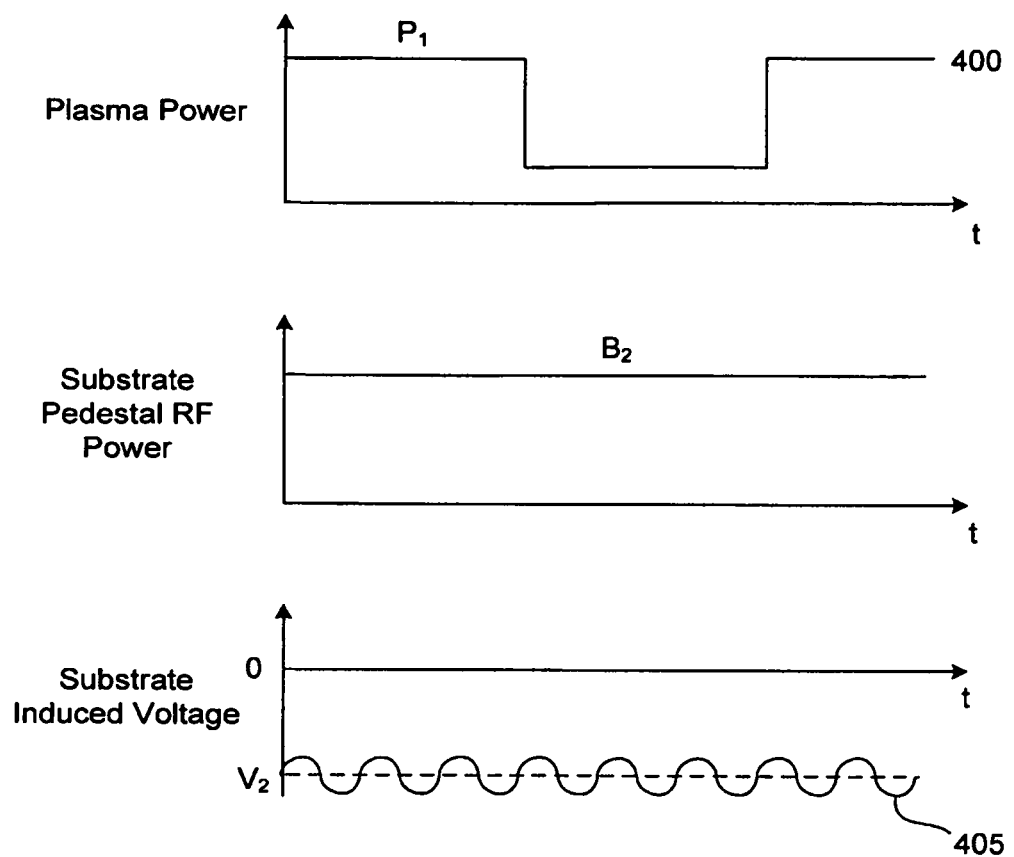
FIGS. 7A, 7B, 7C and 7D show methods of modulating the MII-ALD process.
Figure 7B:
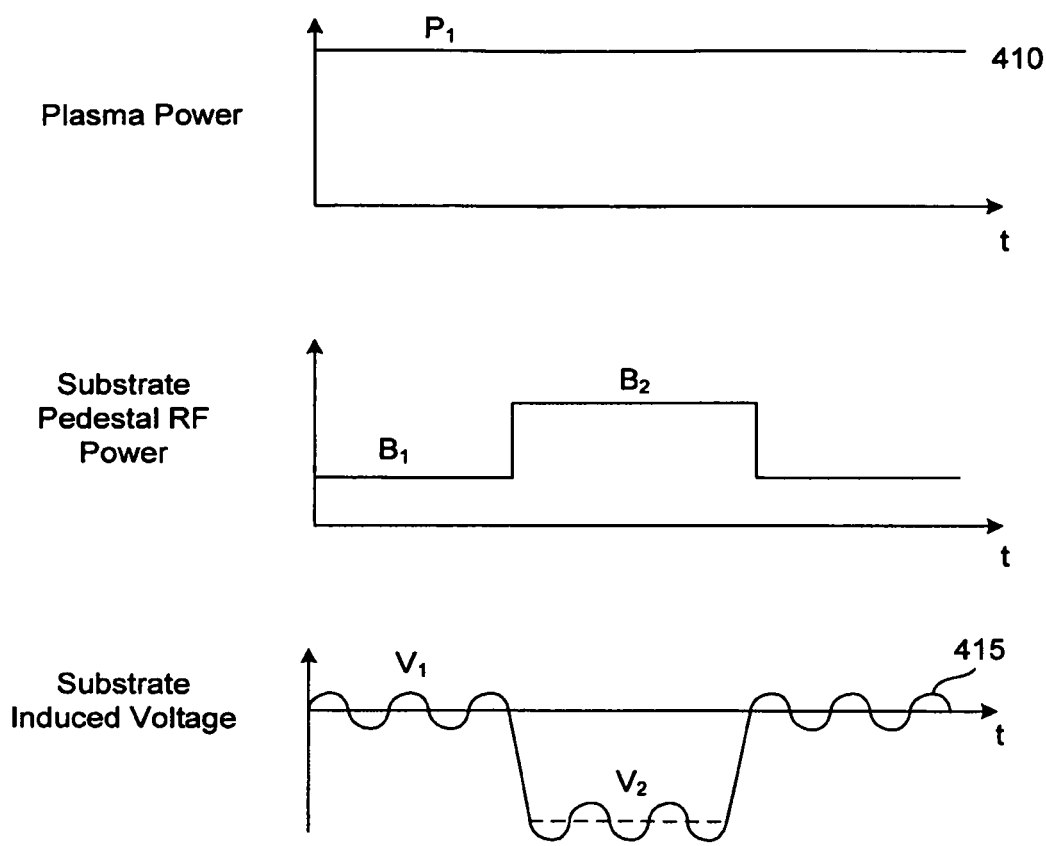
Figure 7C:
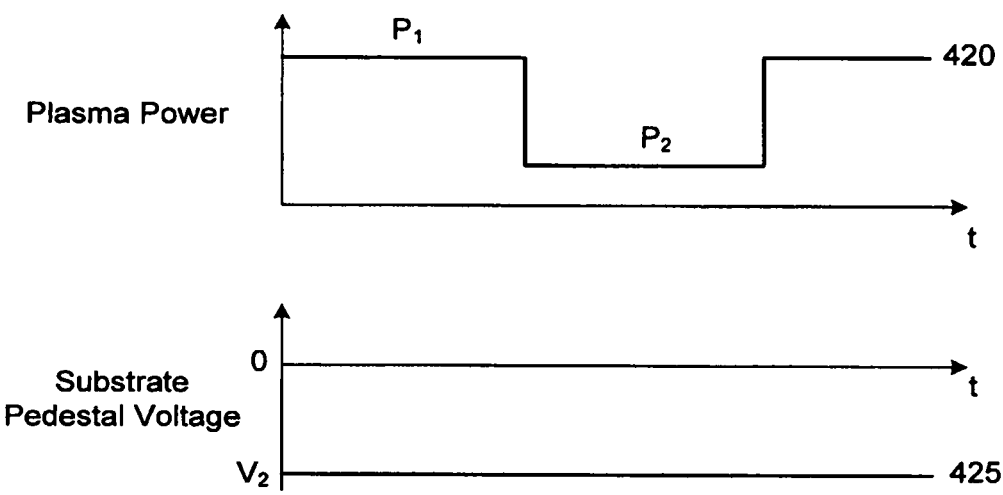

The MII-ALD method utilizing ion flux modulation to control the deposition cycle is illustrated conceptually in FIG. 6A, with the flux modulation scheme described more explicitly in FIGS. 7A and 7C. FIG. 6A depicts the MII-ALD method utilizing constant first precursor exposure 600 and ion flux modulation 620 to vary the substrate 181 exposure to ions 177. Note that the second reactant 610, for example, radicals, is synchronized with the ion flux via 620 plasma power modulation, causing a periodic exposure of the substrate to ions and radicals. Varying the power 160 delivered to the plasma 172, as shown by line 400 in FIG. 7A and line 420 in FIG. 7C, can vary the ion flux from little or none to maximum ion production. Plasma power modulation can take the form of variations in frequency (periodicity), magnitude, and duty-cycle. Increasing plasma power 160 leads to increasing plasma 172, and hence, increased ion 177 density. Since the deposition process is ion-induced, having little or no ion bombardment will essentially stop the deposition process, whereas increased ion bombardment will cause deposition to occur. A constant wafer bias 185 (DC in FIG. 7C or RF in FIG. 7A) is applied to define the ion energy of the modulated ion flux in this embodiment and is chosen to be sufficiently high so that ion-induced surface reactions can occur. The constant wafer bias 185 induces a time-averaged constant induced voltage 405 on the substrate where an RF bias is used, as shown in FIG. 7A, or a constant induced voltage 425 on the substrate where a DC bias is used, as shown in FIG. 7C. Note that in this embodiment since the plasma (either RF or microwave) power 160 is used to generate both ions 177 and radicals 176, the second reactant (for example, radicals) flux 610 is synchronized with the ion flux 620 pulses. The radical feed gas 110 flow, however, does not change. Instead, the radical flux 610 is modulated.

Figure 6B:
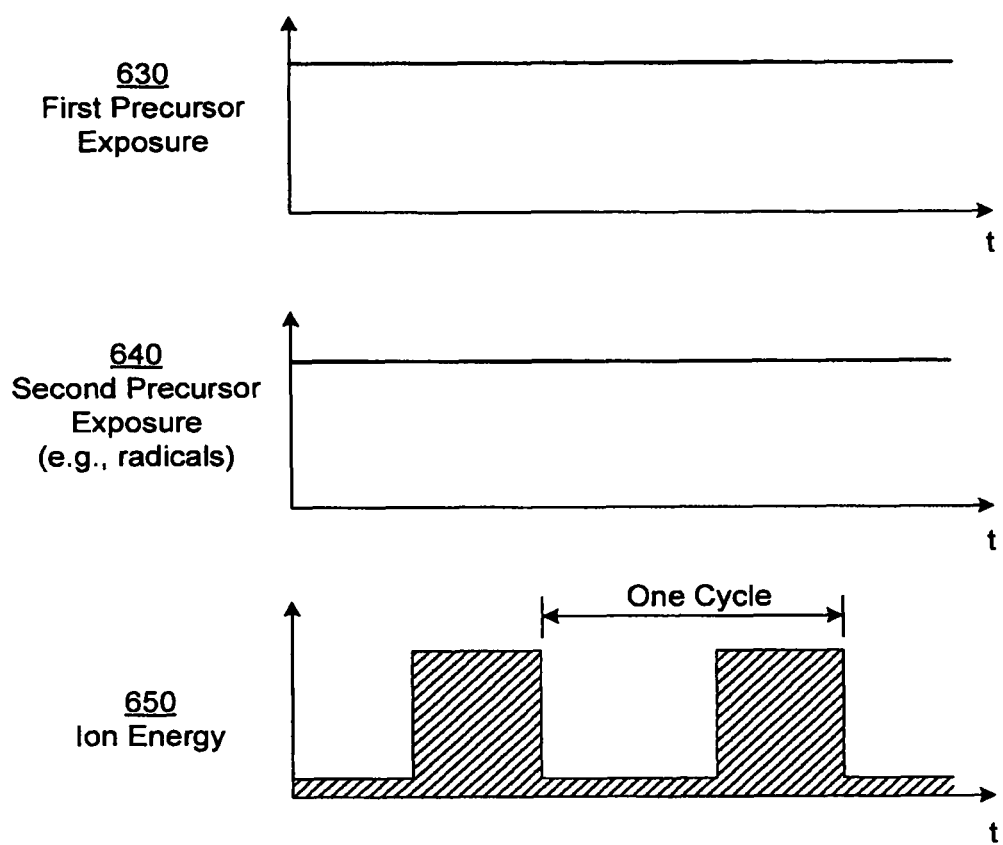
FIG. 6B shows the timing of the MII-ALD method utilizing ion energy modulation to vary the substrate exposure to ions by varying the substrate bias.
Figure 7D:
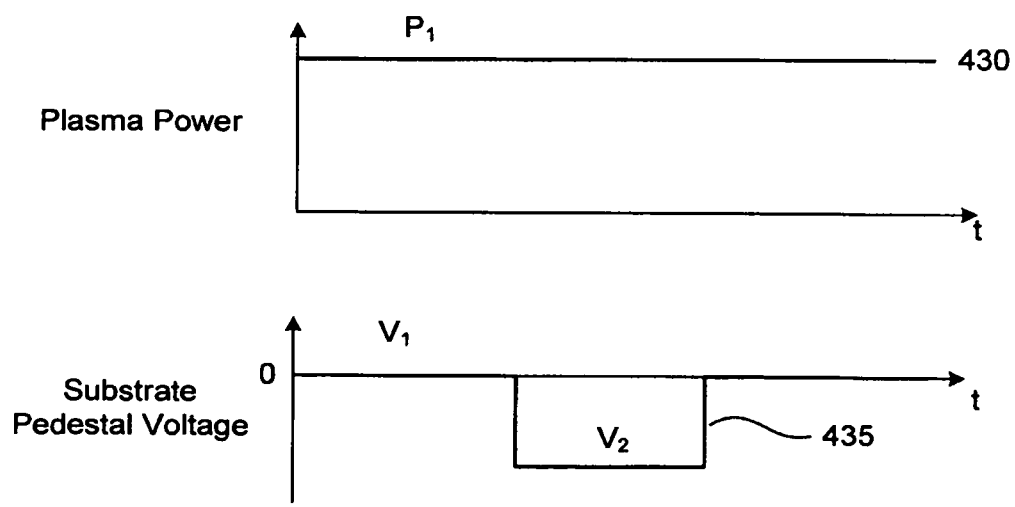

Alternatively, subjecting the substrate 181 to a non-constant wafer voltage bias 185 can vary the incoming ion energy at a fixed plasma power 160 (that is, ion flux).The fixed plasma power is shown by line 410 in FIG. 7B and line 430 in FIG. 7D. This embodiment of MII-ALD is illustrated conceptually in FIG. 6B, and more explicitly in FIGS. 7B and 7D. FIG. 6B shows the MII-ALD method utilizing constant first precursor exposure 630 and second precursor exposure 640 (e.g., readicals) with ion energy modulation 650 to vary the substrate 181 exposure to ions 177 by varying the substrate bias 185. The applied bias 185 can take the form of variations in frequency (periodicity), magnitude, and duty-cycle. A DC, as shown in FIG. 7D, or RF (for example, 400 kHz, 2 MHz, 13.56 MHz, etc.), as shown in FIG. 7B, power supply can be used. When the wafer potential is "low" (for example, near or at zero with respect to ground), the incoming ions 177 do not have enough energy to induce surface deposition reactions. When the wafer 181 potential is "high" (for example, at a significant negative potential relative to ground), the incoming ions 177 will have the necessary energy to induce surface deposition reactions via collision cascades. In such a fashion, the deposition can be turned "on" or "off" by modulating the wafer bias voltage 185 and hence the impinging ion 177 energy. Typical wafer voltages can range from generally −20 V to −1000 V, but preferably in the −25 V to −500 V range, and more preferably in the −50 V to −350 V range during deposition. The bias voltage 185 is coupled to the wafer via the pedestal 182. The bias voltage 185 induces a varying voltage on the substrate, as shown by line 415 in FIG. 7B and line 435 in FIG. 7D. The substrate pedestal 182 may be an electrostatic chuck (ESC) to provide efficient coupling of bias voltage to the substrate. The ESC is situated in the main processing chamber 180 and can be cooled via a fluid coolant (preferably a liquid coolant) and/or heated (for example, resistively) to manipulate the substrate temperature.

Once the deposition rate is calibrated for a particular recipe (Angstroms/cycle), the ability to accurately determine the film thickness by counting cycles is a further benefit of this modulation scheme. The higher the frequency, the finer the resolution of this critical deposition process performance metric.

This process utilizes independent control over the three constituents of plasma—ions, atoms, and precursors. Decoupling these constituents offer improved control over the deposition process.

Figure 8:
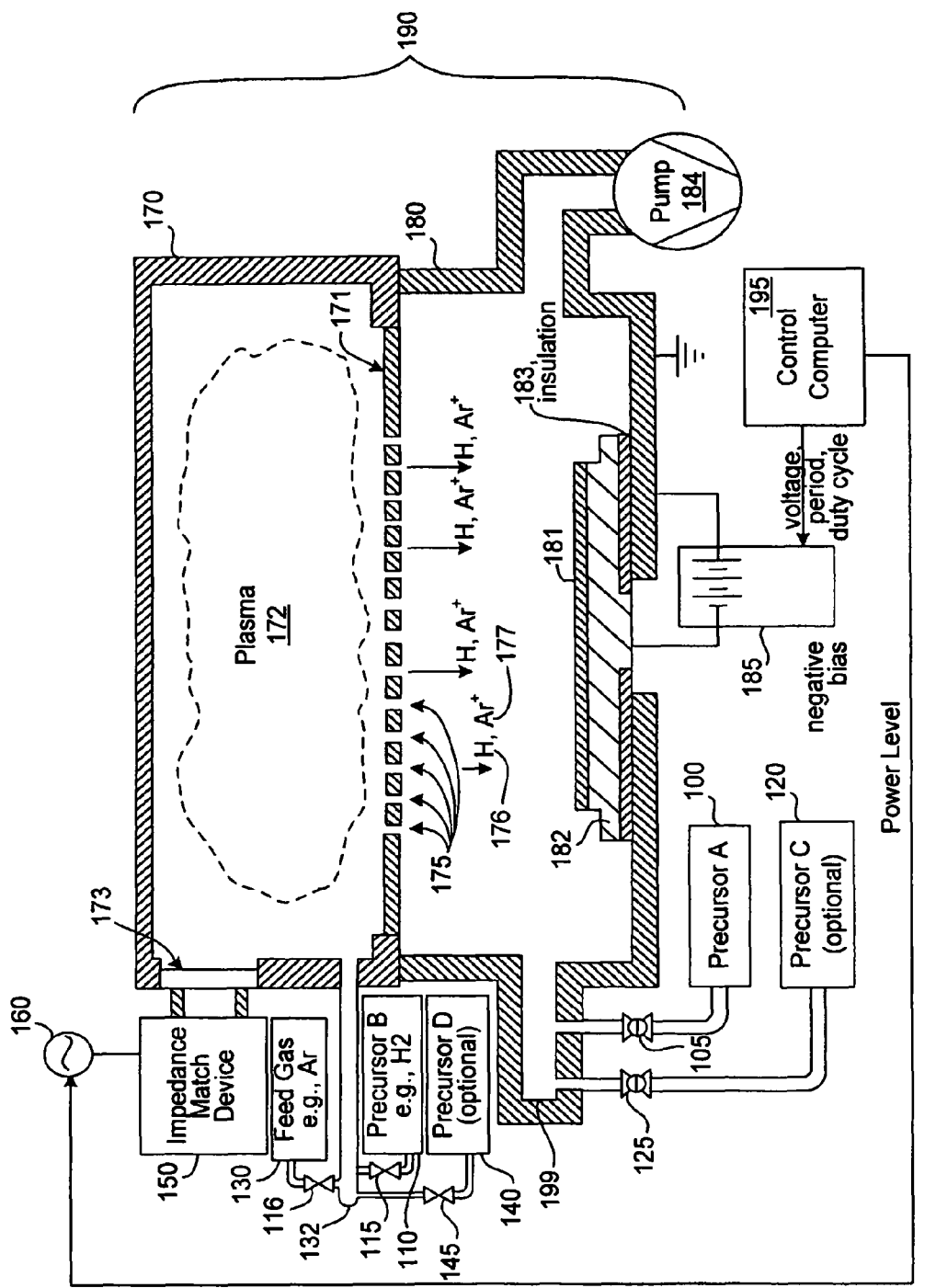
FIG. 8 is a schematic of another embodiment of a deposition system suitable for MII-ALD deposition.

Another embodiment of a deposition system suitable for MII-ALD is shown in FIG. 8. The MII-ALD system of FIG. 8 employs a microwave generated plasma 172 substantially contained in the main chamber body 190 that is isolated via the distribution showerhead 171. The plasma, in one embodiment, is contained within what may be called the plasma source chamber 170, and the plasma is not in direct communication with a substrate or wafer 181.

Inductively coupled radio frequency (RF) (for example, 400 KHz, 2 MHz, 13.56 MHz, etc.) power 160 can be used to generate the plasma via solenoidal coils located within or outside of the plasma chamber (not shown in FIG. 8). Alternatively, microwave (for example, generally 2.45 GHz or higher frequencies) power is coupled to the chamber 170 via, for example, a waveguide or coaxial cable. Microwave energy can be more efficiently transferred to ionizing electrons, leading to higher ionization fractions. This is of particular importance in the generation of radicals 176 (that is, a chemical fragment of a larger molecule) such as atomic hydrogen, or any of a number of other reactive groups such as nitrogen atoms, or NH molecules, or a combination thereof. These radicals serve as the second reactant, if needed. Microwave or RF power is coupled to the plasma 172 via a dielectric material 173, which may be a dielectric window such as quartz embedded in the chamber wall, or it may be empty space in the case of a microwave or RF antenna located within the plasma chamber.

In addition, the distribution showerhead 171, containing the series or array of apertures 175 through which ions 177 and radicals 176 are delivered to the substrate 181, isolates the main process chamber 180 from the plasma source chamber 170. A pressure drop (for example, a 5 or 10 times decrease in pressure, with the main processing chamber 180 being at the lower pressure) is thereby created between the chamber 170 and the main processing chamber 180 to project the ions 177 and radicals 176 to the substrate 181 via the distribution showerhead 171. The first reactant 100 (e.g., precursor A) and optional second reactant 120 (e.g., precursor C) may be delivered through an inlet 199 coupled directly to the main processing chamber 180, below the distribution showerhead 171. The chamber 170 is generally of comparable diameter to the main chamber body 190 to enable large area exposure of the sample. The size, aspect ratio, and distribution of the showerhead apertures 175 can be optimized to provide uniform exposure to the substrate 181 and the desired ion 177 to radical 176 ratio. The distance between this showerhead 171 and the substrate 181 may vary depending on the application.

The ion/radical distribution showerhead 171 shields the dielectric wall 173 adjacent to the supplied RF or microwave power 160 against being coated by precursor A during processing which can degrade power transfer to the plasma 172. This is of particular importance in the case of deposition of conductors whereby if the dielectric 173 is fully exposed to the metal containing the first reactant 100 (for example, precursor A) and if the plasma 172 was directly generated within the main chamber 190 without the use of an isolating distribution showerhead 171, then metal deposition onto the dielectric 173 will eventually shield out RF or microwave power 160 from the plasma 172 such that the plasma 172 will extinguish.

The precursor gas (precursor A), in one implementation, may be exposed to the plasma in the region between the gas line 132 and the showerhead 171. The precursor gas may also be exposed to the plasma in the region below the showerhead.

As discussed above, the substrate is exposed to a sequence of discreet states. Each of the states represent a step in a deposition cycle. The sequence of steps is repeated to produce a film of a desired thickness. In at least one of the steps, the substrate is exposed to a vapor containing at least one precursor chemical. The precursor dose adsorbs onto the substrate. This step is followed by an ion-induced reduction of the adsorbed precursor layer to an elemental state.

The plasma may be generated by microwave or RF power. The plasma may also be generated by DC power. The excitation source, in other embodiments, may be ultraviolet light, x-rays, a high DC field, or some other form of electromagnetic radiation.

The method of the present invention can be used to deposit metal films, used in the semiconductor, data storage, flat panel display, and allied as well as other industries. This present invention allows the deposition of elemental films by a cyclical deposition process directly without an oxidizing ambient and without requiring the intermediate deposition of or conversion to an oxide or nitride followed by the subsequent reduction to the elemental state.

From the description of the preferred embodiments of the process and apparatus set forth above, it is apparent to one of ordinary skill in the art that variations and additions to the embodiments can be made without departing from the principles of the present invention. As an example, the deposition can be accomplished globally, as illustrated in the preceding embodiments, or may be chosen to be local to a controlled area, that is, site-specific using a small, ion beam point or broad-beam source scanned or otherwise stepped across the substrate, exposing only a fraction of the substrate area at any given time.

What is claimed is:

1. A method for depositing an elemental film onto a substrate in a chamber comprising:
   introducing a reactant gas into the chamber, the reactant gas forming a layer of adsorbed reactant on the substrate;
   introducing at least one ion generating feed gas into the chamber;
   generating a plasma from the ion generating feed gas to form ions, wherein during generation of the plasma, a position of the substrate and a position of the plasma do not change relative to one another;
   exposing the substrate to the ions;
   varying a bias applied to the substrate to modulate the ions between a low energy state and a high energy state, wherein ions at the low energy state have insufficient energy to induce surface deposition reactions with the layer of adsorbed reactant and wherein ions at the high energy state have sufficient energy to induce surface deposition reactions with the layer of adsorbed reactant, wherein the bias applied to the substrate is varied to cause the depositing, while the plasma is generated continuously and the substrate is continuously exposed to the ions; and
   reacting the layer of adsorbed reactant with the ions at the high energy state to form the elemental film.

2. The method of claim 1, wherein adsorption of the reactant gas on the substrate occurs via chemisorption.

3. The method of claim 1, wherein the method is repeated until the film achieves a desired thickness.

4. The method of claim 1, wherein the reacting step occurs in a reducing environment.

5. The method of claim 1, further comprising removing the reactant gas by evacuating or purging the chamber.

6. The method of claim 1, wherein the ion generating feed gas is selected from a group consisting of argon, krypton, neon, helium, and xenon.

7. The method of claim 1, wherein the generated ions are selected from a group consisting of $Ar^+$, $Kr^+$, $Ne^+$, $He^+$, and $Xe^+$.

8. The method of claim 1, further including maintaining the substrate at a temperature of between about 25° C. and 400°

C., wherein the temperature is sufficiently low such that the layer of adsorbed reactant does not react with the ions at the low energy state.

9. The method of claim 1, wherein the layer of adsorbed reactant is reduced to its elemental state by an ion-induced surface reaction.

10. The method of claim 1, wherein the reactant gas is exposed to the substrate continuously.

11. The method of claim 1, wherein the bias applied to the substrate is varied within a range between −20V and −1000V.

12. The method of claim 1, wherein varying the bias applied to the substrate comprises varying at least one of a bias frequency, magnitude and duty-cycle.

13. The method of claim 1, wherein the bias applied to the substrate is varied within a range between −50V and −350V.

14. The method of claim 1, wherein the plasma is generated at a constant plasma power.

15. The method of claim 1, wherein the chamber comprises a showerhead, and wherein the plasma is generated between the showerhead and the substrate.

16. The method of claim 1, wherein the chamber comprises a main processing chamber, a plasma source chamber, and a showerhead separating the main processing chamber from the plasma source chamber, wherein the substrate is positioned in the main processing chamber, and wherein the plasma is generated in the plasma source chamber such that the plasma is not in direct communication with the substrate.

17. The method of claim 1, wherein the bias applied to the substrate is varied by varying a bias applied by a power supply to a pedestal that supports the substrate, the pedestal being coupled to the substrate, and wherein a position of the substrate and a position of the plasma do not change relative to one another after the plasma is generated.

18. A method for depositing an elemental film onto a substrate in a chamber comprising:
    introducing a reactant gas into the chamber, the reactant gas forming a layer of adsorbed reactant on the substrate;
    introducing at least one ion generating feed gas into the chamber;
    introducing at least one radical generating feed gas into the chamber;
    generating a plasma from the ion generating feed gas and a plasma from the radical generating feed gas to form ions and radicals, wherein during generation of the plasma from the ion generating feed gas and the plasma from the ion generating feed gas, a position of the substrate does not change relative to a position of the plasma from the ion generating feed gas or relative to a position of the plasma from the radical generating feed gas;
    exposing the substrate to the ions and radicals;
    varying a bias applied to the substrate to modulate the ions between a low energy state and a high energy state, wherein ions at the low energy state have insufficient energy to induce surface deposition reactions with the layer of adsorbed reactant and wherein ions at the high energy state have sufficient energy to induce surface deposition reactions with the layer of adsorbed reactant, wherein the bias applied to the substrate is varied to cause the depositing, while the plasma is generated continuously and the substrate is continuously exposed to the ions; and
    reacting the layer of adsorbed reactant with the ions at the high energy state and with radicals to form the elemental film, wherein the radicals are not incorporated into the film.

19. The method of claim 18, wherein the substrate is simultaneously exposed to the ions and the radicals.

20. The method of claim 18, wherein the bias is applied to the substrate by applying a bias to a pedestal coupled to the substrate, and wherein the substrate is biased to a negative potential relative to ground.

21. The method of claim 18, wherein the radical generating feed gas is selected from the group consisting of $H_2$, $N_2$, and $NH_3$ vapor.

22. The method of claim 18, wherein the generated radicals are selected from a group consisting of hydrogen atoms, nitrogen atoms and NH molecules.

23. The method of claim 18, wherein the method is repeated until the film achieves a desired thickness.

24. The method of claim 18, further comprising removing the reactant gas by evacuating or purging the chamber.

25. The method of claim 18, wherein the adsorbed reactant is reduced to its elemental state by an ion-induced surface reaction.

26. The method of claim 18, wherein a single plasma is generated from the ion generating feed gas and from the radical generating feed gas to form ions and radicals.

27. A method for forming an elemental film on a substrate comprising:
    introducing a reactant gas into a chamber, the reactant gas forming a layer of adsorbed reactant on the substrate;
    introducing at least one ion generating feed gas into the chamber;
    generating a plasma from the ion generating feed gas to form ions, wherein during generation of the plasma, a position of the substrate and a position of the plasma do not change relative to one another;
    exposing the substrate to the ions;
    varying a bias applied to the substrate to modulate the ions between a low energy state and a high energy state, wherein ions at the low energy state have insufficient energy to induce surface deposition reactions with the layer of adsorbed reactant, and wherein ions at the high energy state have sufficient energy to induce surface deposition reactions with the layer of adsorbed reactant, wherein the bias applied to the substrate is varied to cause the depositing, while the plasma is generated continuously and the substrate is continuously exposed to the ions; and
    reacting the layer of adsorbed reactant with the ions at the high energy state to form the elemental film on the substrate without first having formed an intermediate film on the substrate of a composition different than that of the layer of adsorbed reactant.

* * * * *